United States Patent [19]
Becker et al.

[11] Patent Number: 5,883,834
[45] Date of Patent: *Mar. 16, 1999

[54] LOW POWER CONSUMING MEMORY SENSE AMPLIFYING CIRCUITRY

[75] Inventors: Scott T. Becker; Daniel F. LaBouve, both of San Jose; Dhrumil Gandhi, Cupertino, all of Calif.

[73] Assignee: Artisan Components, Inc., Sunnyvale, Calif.

[*] Notice: The term of this patent shall not extend beyond the expiration date of Pat. No. 5,717,633.

[21] Appl. No.: 937,561

[22] Filed: Sep. 25, 1997

Related U.S. Application Data

[63] Continuation of Ser. No. 798,816, Feb. 11, 1997, Pat. No. 5,717,633.

[51] Int. Cl.$^6$ ..................... G11C 16/06
[52] U.S. Cl. .............. 365/185.21; 365/185.16; 365/185.23; 365/104; 365/207
[58] Field of Search .......... 365/185.21, 185.16, 365/185.23, 185.25, 104, 207

[56] References Cited

U.S. PATENT DOCUMENTS

| | | | |
|---|---|---|---|
| 4,128,900 | 12/1978 | Lappington | 365/94 |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.09 |
| 5,555,521 | 9/1996 | Hamada et al. | 368/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,636,161 | 6/1997 | Mann | 365/185.21 |
| 5,654,919 | 8/1997 | Kwon | 365/185.21 |
| 5,694,369 | 12/1997 | Abe | 365/210 |
| 5,699,295 | 12/1997 | Yero | 365/185.21 |

*Primary Examiner*—Huan Hoang
*Attorney, Agent, or Firm*—Hickman & Martine, LLP

[57] ABSTRACT

Low power consuming circuitry for amplifying sensed signals in memory devices is disclosed. The low power circuitry includes a amplifier circuit having a data bus line for receiving a data signal from a selected column of a memory array. The data bus line being coupled to a first pre-charger transistor for limiting a data bus voltage swing, and a virtual ground control line for controlling a virtual ground application to a selected column of the memory array. The virtual ground application configured to provide a path to ground for the selected column, and the virtual ground control line being coupled to a second pre-charger transistor for limiting a virtual ground voltage swing. Further included is a gain transistor configured to receive the data signal from the data bus line and provide an amplified data signal to a pull down node located at an input of an inverter. And, a digital data output node located at an output of the inverter. The digital data output node being coupled to a gate of a positive feedback transistor, and a drain of the positive feedback transistor being coupled to the pull down node.

22 Claims, 8 Drawing Sheets

LOW POWER CONSUMING MEMORY SENSE AMPLIFYING CIRCUITRY

This is a request for filing a continuation application under 37 C.F.R. § 1.60 of prior application U.S. Ser. No. 08/798,816 filed on Feb. 11, 1997 in the name of Scott T. Becker, Daniel F. LaBouve and Dhrumil Gandhi, now U.S. Pat. No. 5,717,633, and from which priority under 35 U.S.C. § 120 is claimed.

CROSS REFERENCE TO RELATED APPLICATIONS

This application is related to U.S. patent application having Ser. No. 08/797,347, and inventors Scott T. Becker, Daniel F. LaBouve, Dhrumil Gandhi, and filed on Feb. 11, 1997.

BACKGROUND OF THE INVENTION

1. Field of the Invention

The present invention relates generally to integrated circuits, and more particularly to low power consuming memory sense amplifying circuitry.

2. Description of the Related Art

Read only memory (ROM) devices are generally array structures having a multiplicity of columns and a multiplicity of rows. Although any row and associated column may be addressed in a ROM, only selected row and column intersections may activate a storage transistor. Typically, when an intersection containing a storage transistor is addressed, digital data representing a "0-bit" is read. On the other hand, when an intersection that does not contain a storage transistor is addressed, digital data representing a "1-bit" is read. As is well known in the art, once digital data is addressed within a ROM device, a very small voltage amplitude representing the addressed digital data is sensed. However, to produce a readable voltage amplitude representing useful digital data, a sense amplifier is typically implemented to amplify the sensed digital data which may be a 0-bit or a 1-bit.

Figure 1A:
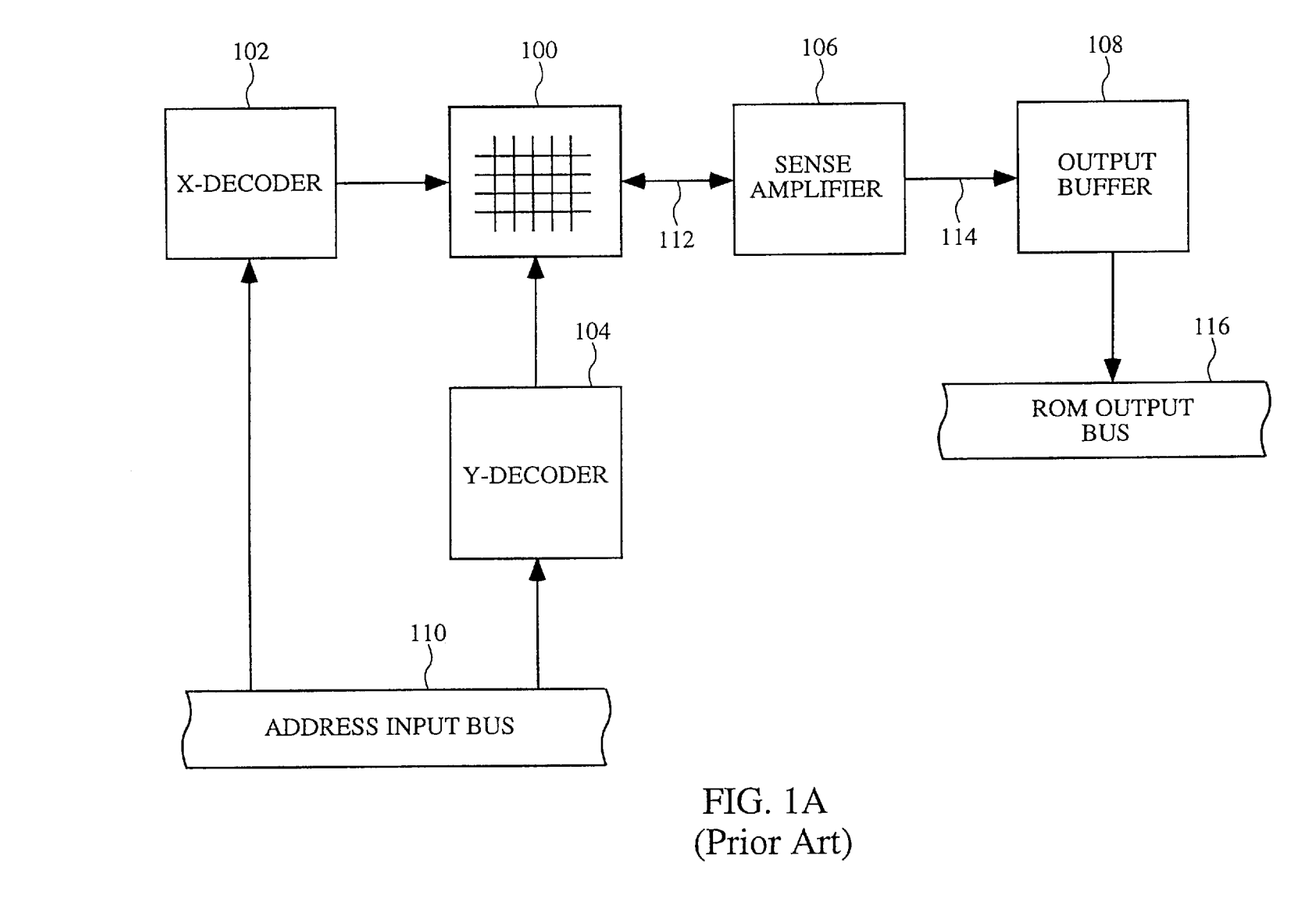
FIG. 1A shows a conventional ROM addressing block diagram used for accessing data stored within a read only memory core.

FIG. 1A shows a conventional ROM addressing block diagram used for accessing digital data stored within a ROM core 100. By way of example, when ROM core 100 includes 1,000 rows by 1,000 columns, ROM core 100 may be classified as a one megabit (1 MB) ROM storage device. Accordingly, host computers typically access ROM core 100 through an address input bus 110 that may be coupled to a conventional X-DECODER 102 and a conventional Y-DECODER 104. In general, X-DECODER 102 is used for addressing a selected row within ROM core 100, and Y DECODER 102 is used for addressing a selected column within ROM core 100. By way of example, X and Y decoders are generally implemented for reducing memory array aspect ratios by filing (i.e., dividing) long addressable memory columns into several shorter memory columns. Once folded into several columns, the X and Y decoders are capable of accessing the addressed data by appropriately performing a suitable muliplexing function.

Once a row and column is selected from ROM core 100, a very low voltage which may be as low as 20 milli-volts (mV) may be sensed on a data bus 112 representing the addressed data. As described above, to appropriately read the addressed data, suitable amplification is typically performed in a sense amplifier 106. Once the sensed data signal is amplified to about 3.3 volts or about 5 volts in sense amplifier 106, the voltage amplified data (i.e., digital data) is passed through as an amplified data output 114 to an output buffer 108. At output buffer 108, the voltage amplified data is current amplified to provide an appropriate level of current drive once the read data is passed to a ROM output bus 116.

Figure 1B:
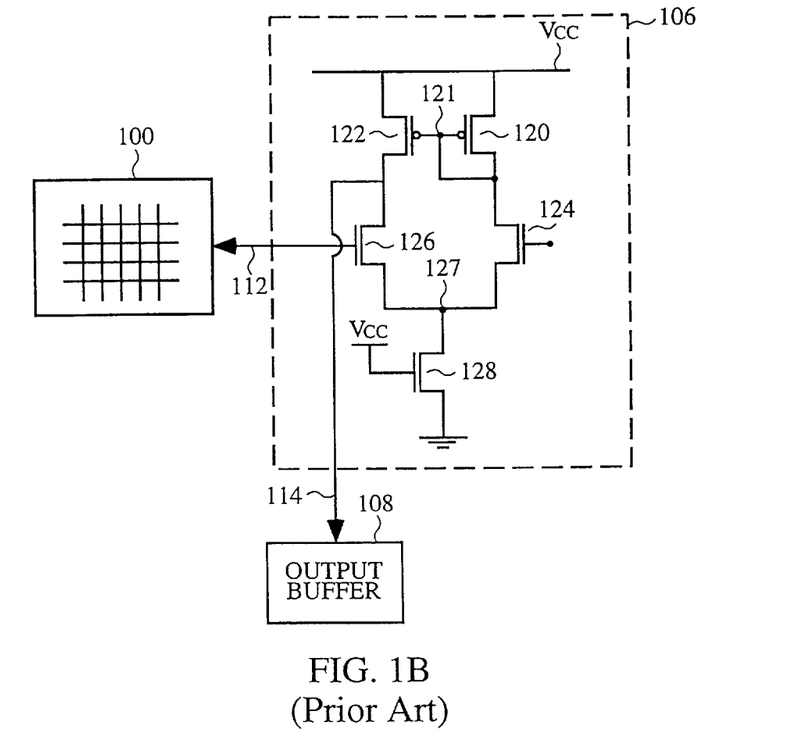
FIG. 1B illustrates a conventional single ended differential pair sense simplifier.

FIG. 1B illustrates a conventional single ended differential pair sense amplifier 106. As shown, sense amplifier 106 includes a rail voltage (Vcc) which is typically about 3.3 volts or 5 volts connected to a transistor 122 and a transistor 120 that form a well known current mirror. Connected to the current mirror transistors is a gain transistor 126 and a gain transistor 124. A gate of gain transistor 124 is then coupled to a $V_{REF}$ which is typically about Vcc/2. Further, a gate of gain transistor 126 is shown interfacing with ROM core 100 via data bus 112 as described above. Coupled between transistor 122 and gain transistor 126 is amplified data output 114 that feeds to output buffer 108 where appropriate current amplification is performed.

Figure 1C:
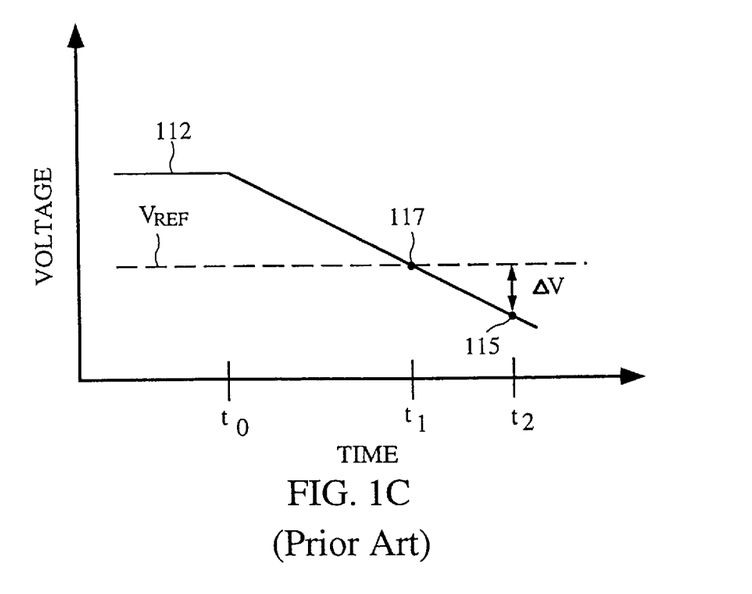
FIG. 1C shows a conventional voltage response of data bus during amplification in the single ended differential pair sense amplifier of FIG 1B.

FIG. 1C shows a conventional voltage response of data bus 112 with respect to time during an amplification operation by sense amplifier 106. As shown, data bus 112 initially starts at an approximate rail voltage (i.e., Vcc) of about 3.3 volts. As an example, when a memory location is addressed within ROM core 100 at a time $t_0$, the voltage level on data bus 112 begins to decline over time due to current pull on data bus 112. As shown, the voltage level on data bus 112 continues to decline past a point 117 at time $t_1$ (i.e., when data bus 112 intersects $V_{REF}$) until a point 115 at time $t_2$ is reached. Once time $t_2$ is reached at a voltage difference "AEV" between $V_{REF}$ and data bus 112, sense amplifier 106 is triggered to a "HI" state and produces amplified data to output buffer 108 via amplified data output 114.

In general, if a AEV of about 50 mV is desired, sense amplifier 106 generally has to produce a gain of about 60 to produce about a 3 volt voltage swing at the output. Accordingly, by increasing the gain of sense amplifier 106, designers have been able to increase the speed at which sense amplifier 106 switches. Unfortunately, typical sense amplifiers are optimized for speed while ignoring the consequential increased levels of power consumption during memory accessing operations.

Generally the above described conventional ROM architecture works well for most applications in which low power consumption is not of any particular concern. However, in applications where low power consumption is needed, the high power consuming response of sense amplifier 106 may not be acceptable. Accordingly, sense amplifier 106 is not well suited for use in portable electronic devices that critically depend on a battery's limited useful life. As an example, many modern hand-held portable electronics devices such as laptop computers, pen-based computers and cellular phones, are many times rendered useless when memory accessing operations drain the electronic devices's battery.

In view of the foregoing, there is a needed for methods and apparatuses for providing low power consuming amplifiers used for memory accessing operations. In addition, there is a need for methods and apparatuses for efficiently powering down circuit devices within a sense amplifier once memory accessing amplification and data output latching is complete.

SUMMARY OF THE INVENTION

Broadly speaking, the present invention fills these needs by providing a low power consuming sense amplifier used in memory accessing operations. Further, the present invention provides methods for efficiently powering down amplifying and latching circuits implemented in ROM memory accessing operations. It should be appreciated that the present invention can be implemented in numerous ways, including as a process, an apparatus, a system, a device, or a method. Several inventive embodiments of the present invention are described below.

In one embodiment, a low power amplifier circuit is disclosed. The low power amplifier circuit includes a data bus line for receiving a data signal from a selected column of a memory array. The data bus line being coupled to a first pre-charger transistor for limiting a data bus voltage swing, and a virtual ground control line for controlling a virtual ground application configured to provide a path to ground for the selected column, and the virtual ground control line being coupled to a second pre-charger transistor for limiting a virtual ground voltage swing. Further included is a gain transistor configured to receive the data signal from the data bus line and provide an amplified data signal to a pull down node located at an input of an inverter. And, a digital data output node located at an output of the inverter. The digital data output node being coupled to a gate of a positive feedback transistor, and a drain of the positive feedback transistor being coupled to the pull down node.

In another embodiment, a low power output data latching circuit is disclosed. The low power output data latching circuit includes a logic gate configured to receive a high clock signal and a high read enable signal. The logic gate having an output node coupled to a p-type transistor of a first tristate inverter, an input to a first inverter and an n-type transistor of a second tristate of a second tristate inverter. An activating node interconnecting an output of the first inverter, an n-type transistor of the first tristate inverter, and a p-type transistor of the second tristate inverter. And, an output node connected to output of the first tristate inverter, an input of a second inverter, and an output of the second tristate inverter.

Advantageously, the various embodiments of the present invention provide substantial power saving by maintaining the output data latching circuit in an off state until digital data is ready to be output and latched. Further, once latched, the output data latching circuit is rapidly (e.g., within a pulse) shifted back to an off state. In addition, once read data is amplified and passed to the output data latching circuit, the amplifier circuit and a corresponding virtual ground controller contained within the amplifier circuit is switched off to prevent an unnecessary power drain.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a low power consuming sense amplifier implemented in memory array accessing operations is disclosed. The present invention also discloses methods for efficiently triggering a rapid power down operation once an output latch circuit outputs data accessed from a memory storage device. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As is well known in the art, electrical circuits typically consume two types of power. The first type is alternating current (AC) power which is defined as capacitance times a voltage squared times frequency (AC power=$C \times V^2 \times f$). Because the voltage component is a squared value, designers concerned with reducing power consumption will receive increased power savings by reducing voltage levels in operating circuits. The second type of power is that consumed by direct current (DC) circuitry. In general, DC power consumption is typically reduced by eliminating short circuits between a rail voltage (i.e., Vcc) and ground. Accordingly, the present invention implements numerous power saving techniques that individually contribute to substantial power savings when performing sense amplifications used in performing memory device accessing operations.

Figure 2:
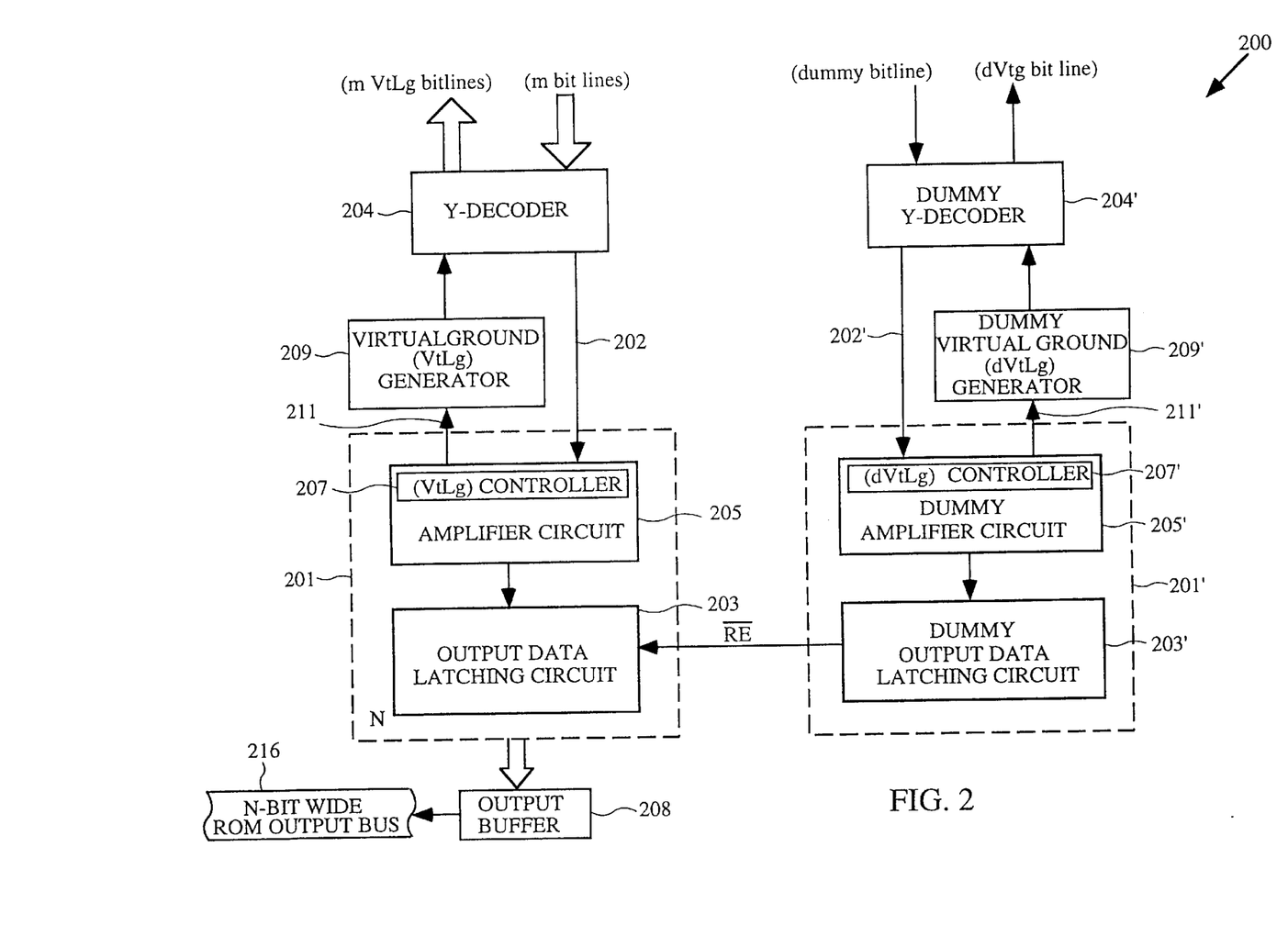
FIG. 2 shows an overview functional diagram of a low-power sense amplifying architecture in accordance with one embodiment of the present invention.

FIG. 2 shows an overview functional diagram of a low-power sense amplifying architecture 200 in accordance with one embodiment of the present invention. Architecture 200 generally includes a sense amplifier core 201 that preferably includes an amplifier circuit 205 and an output data latching circuit 203, and a dummy sense amplifier core 201' that preferably includes a dummy amplifier circuit 205' and a dummy output data latching circuit 203'. Broadly speaking, dummy amplifier core 201' is preferably implemented as timing circuit that provides a read enable signal to output data latching circuit 203. The provided read enable signal (/RE) preferably operates to "turn on" output data latching circuit 203. Because dummy sense amplifier core 201' acts as a timing circuit, when output data latching circuit 203 is turned on, the amplifier circuit 205 has now produced digital data that is fed back to "turn off" amplifier circuit 205 and "turn off" a virtual ground (VtLg) controller contained within amplifier circuit 205. Accordingly, while sense amplifier circuit 205 is sensing data being read from a read only memory (ROM) core, output data latching circuit 203 is maintained in a power saving "off" state.

Although only one sense amplifying core 201 is shown for ease of description, it should be understood that a one sense amplifying core 201 is generally implemented for reading a single bit of data from a suitable memory array. Accordingly, it should be appreciated that sense amplifying core 201 may be replicated any number of (N) times depending on a particular design's requirements. By way of example, if a 16-bit wide, 32-bit wide, or an N-bit wide output is desired, sense amplifying core 201 may be replicated 16 times, 32 times or N times, respectively. On the other hand, only one dummy sense amplifying core 201' is preferably provided to communicate a timing read enable signal to each of the implemented output data latching circuits 203.

Architecture 200 also includes a Y-DECODER 204 that is generally implemented for accessing m bit lines, where "m" defines the number times a single column is folded for maintaining a suitable ROM array aspect ratio. A virtual ground (VtLg) signal bus identified as (m) bit lines are generally used for applying a virtual ground voltage to a selected column accessed through Y-DECODER 204. By way of example, if Y-DECODER is a 4 to 1 (i.e., m=4) multiplexer, and "column 1" is selected for reading, then a virtual ground voltage will only be applied to the selected column 1 (i.e., not to columns 2–4) to eliminate a power draining path to ground through the non-selected columns.

In one embodiment, sense amplifying core 201 further includes a virtual ground controller 207 that is preferably contained within amplifier circuit 205. Coupled to virtual ground controller 207 is a virtual ground generator 209 used for providing the aforementioned voltage to selected columns. Accordingly, when a read operation is requested, a virtual ground controller 207 preferably communicates via a control line 211 to virtual ground generator 209. Once virtual ground generator 209 receives a signal from control line 211, the selected column is provided with a virtual ground voltage to provide a suitable path to ground. In this embodiment, the virtual ground voltage applied by virtual ground generator 209 is preferably only applied for a very short period of time while an actual read operation is in progress.

As described above, dummy sense amplifying core 201' is also preferably coupled to a suitable dummy Y-DECODER 204' that is configured to read a dummy bit line in parallel with sense amplifying core 201. As shown, dummy amplifier circuit 205' includes a dummy virtual ground (dVtLg) controller 207' that communicates with a dummy virtual ground generator 209' via a dummy control line 211'. Further, dummy virtual ground generator 209' is shown coupled to dummy Y-DECODER 204'. As described above, dummy sense amplifying core 201' preferably acts as a timing circuit that provides a read enable (/RE) signal to each of the sense amplifying cores 201 that may be implemented in a ROM memory array.

To ensure that dummy sense amplifying core 201' does not prematurely produce an /RE signal to the sense amplifying cores 201 (i.e., before the amplifier circuits 205 produce amplified digital data), the various dummy components are designed to "mirror" the speed and performance of the sense amplifying cores 201. However, dummy Y-DECODER 204' is preferably designed to be less optimum than the Y-DECODERS 204. By way of example, dummy Y-DECODER 204' is preferably designed to always read a "0" (i.e., a transistor intersection) from a single dummy bit line to ensure that the dummy circuitry is always just slightly slower than the non-dummy circuitry. In addition, it should be appreciated that although circuitry components are provided for dummy virtual ground controller 207' and dummy virtual ground generator 209', functionally these components are merely operate to mirror the timing delays experienced by the non-dummy circuitry.

During an exemplary read operation, each of the amplifier circuits 205 as well as dummy amplifier circuit 205' sense a selected data accessing request and begin to amplify (i.e., in terms of voltage) the data through a data bus 202 and a dummy data bus 202'. Of course, during the data selection stage, appropriate virtual ground generation will be performed to assist in reducing power consumption. In addition, it should be understood that while data selection and amplification is in progress, each of the output data latching circuits 203 will be in a substantially non-power consuming off state or off.

Once dummy output data latching circuit 203' receives an amplified "0" data from dummy ;amplifier circuit 205', a read enable (/RE) signal is appropriately propagated to each of the output data latching circuits 203. In one embodiment, dummy output data latching circuit 203' preferably includes high-drive buffers for generating a suitable signal /RE that may be propagated to each of the plurality of output data latching circuits 203 without introducing delays.

Once the /RE signal is propagated to each of the plurality of output data latching circuits 203, the plurality of output data latching circuits 203 are triggered "on". When the output data latching circuits 203 are triggered on, it is expected that the data being read has now been appropriately amplified by amplifier circuit 205 and is waiting to be latched as digital data by output data latching circuits 203. Once the output data latching circuits 203 latch the digital data and output the reading request to an output buffer 208, the output data latching circuits 203 will rapidly shift back to the off state. Advantageously, the rapid shift back to an off state provides a substantial power savings when N number of sense amplifying cores 201 are implemented in a large scale memory device.

In addition to the power savings realized by rapidly switching the output data latching circuit 203 off, each of the amplifier circuits 205 will preferably turn themselves "off" (i.e., via an internal feedback signal) once digital data is passed to the output data latching circuits 203. That is, because the data has already been amplified and passed to output buffer 208, the amplifier circuits 205 no longer need to be consuming power. Accordingly, substantial power savings are advantageously realized by the "turn off" feedback of each of the amplifier circuits 205. Furthermore, additional power savings are realized when each of the virtual ground controller 207 contained within each of the amplifier circuits 205 are likewise substantially simultaneously "turned off" by the aforementioned the "turn off" feedback signal.

In sum, architecture 200 provides substantial power saving by maintaining each of the output data latching circuits 203 in an off state until digital data is ready to be latched. Further, once latched, all of the output data latching circuits 203 will rapidly shift back to an off state. In addition, when the amplifier circuits 203 produce digital data at their outputs, each of the amplifier circuits 205 and corresponding virtual ground controllers 207 are shifted off (i.e., via a turn off feedback signal) to prevent an unnecessary power drain. It should be understood that the above described power saving advantages are best realized when reading a "0" from a selected memory location.

Figure 3:
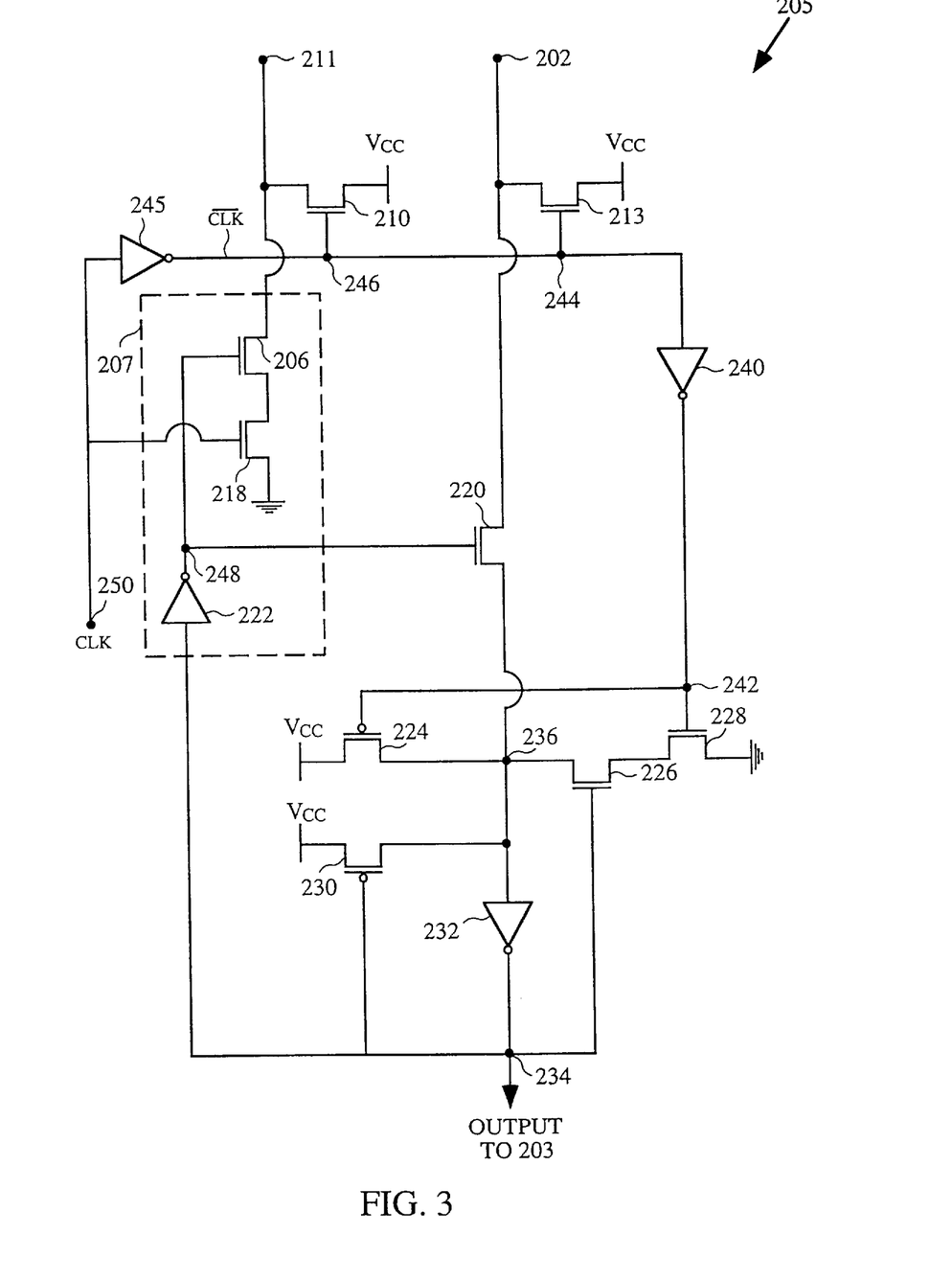
FIG. 3 is a circuit diagram illustrating preferred electrical interconnections within an amplifier circuit and a virtual ground controller in accordance with one embodiment of the present invention.

FIG. 3 is a circuit diagram illustrating preferred transistor interconnections contained within amplifier circuit 205 and virtual ground controller 207 in accordance with one embodiment of the present invention. As shown, a virtual ground control line 211 is coupled to a drain side of a pre-charger transistor 210, and a source connected to Vcc. The gate of pre-charger transistor 210 is coupled to a node 246 that is identical to node 244. Node 244 is in turn coupled to the gate of a second pre-charger transistor 213.

In this embodiment, pre-charger transistor 213 has a source connected to Vcc and a drain coupled to a data bus line 202. Pre-charger transistors 210 and 213 are preferably n-type transistors that provide an appropriate threshold voltage difference across each associated transitor channel. Once Vcc is set to about 3.3 volts, the voltage on virtual ground control line 211 and data bus 202 will be about Vcc–Vt(Vt=threshold voltage). As can be appreciated, lowering the voltage of Vcc by about Vt further contributes to reduced power consumption.

A clock (CLK) signal is shown coupled to a node 250 for providing clock to a clock buffer 245 and a virtual ground transistor 218. The CLK signal is passed through clock buffer 245 that inverts CLK to produce a /CLK signal to nodes 246 and 244. In this embodiment, a virtual ground transistor 218 is shown coupled to ground and a virtual ground transistor 206. Virtual ground transistor 206 is also coupled to virtual ground control line 211. The gate of the virtual ground transistor 206 is connected to a node 248 that is the output of an inverter 222 contained within virtual ground controller 207.

In this embodiment, node 248 also represents a gate connection to a cascode transistor 220. Cascode transistor 220 is in turn coupled to data bus 202 at the drain of pre-charger transistor 213. Cascode transistor 220 is further connected to a node 236. Node 236 is also connected to a source of a transistor 224 and a drain of a feedback transistor 226. As shown, transistor 224 is preferably a p-type transistor having its drain connected to Vcc and its gate connected to a node 242. Node 242 also makes a gate connection to a transistor 228 that is shown connected to ground and feedback transistor 226. Further, the gate of feedback transistor 226 is shown coupled to a node 234 that preferably defines the output of amplifier circuit 205.

Node 236 is also preferably connected to a source of a transistor 230 and also defines an input to an inverter 232. The drain of transistor 230 is connected to Vcc and the gate is connected to node 234. As shown, node 234 also defines an input to inverter 222 contained within virtual ground controller 207. Further shown is an inverter 240 having an input coupled to node 244 and an output leading to node 242. As described above, node 242 provides a common path to the gates of both transistors 224 and transistor 228.

In general, virtual ground controller 207 serves as a controller for initiating an application of a virtual ground voltage to a selected column addressed by a Y-DECODER. Thus, applying the virtual ground voltage only to selected columns substantially reduces unnecessary power consumption. It should further be appreciated that when larger scale Y-DECODERS are implemented (e.g., 32 to 1, 64 to 1, 128 to 1, etc., multiplexers), the power saved by not enabling the non-selected columns substantially increases the power savings.

In operation, when a particular address is sensed and is about the be amplified by amplifier circuit 205, pre-charger transistors 210 and 213 are in an "on" state which lowers the voltage swing (i.e., about 0.7 volts) across the channels of transistors 210 and 213. When a CLK is applied to node 250, CLK is passed to clock inverter 245 where a /CLK signal is output to nodes 246 and 244.

Once a non-amplified data signal is passed down through data bus 202 from a suitable Y-decoder, cascode transistor 220 will preferably amplify the signal to an appropriate voltage level. At this point, amplifier circuit 205 is preferably in a read-mode, and /CLK is passed through inverter 240 that outputs a CLK signal to node 242. Accordingly, CLK is also simultaneously passed to the gates of transistor 224 and 228. The received data signal is therefore amplified at cascode transistor 220, passed through to node 236, and inverted by inverter 232. The amplified data signal is then output as digital data (i.e., a "1") to node 234. Once the data is passed to node 234, positive feedback will occur through feedback transistor 226 in order to simultaneously pull down the voltage level at node 236.

It should be appreciated that providing positive feedback through feedback transistor 226 assists in quickly pulling down the voltage level at node 236 once digital data has been output. Advantageously, quickly pulling down the voltage at node 236 beneficially reduces power consumption and increases switching speeds. Furthermore, when amplifier circuit 205 is in a pre-charging mode (i.e., a non-reading state), transistor 228 will preferably lock out any positive feedback to prevent leakage during pre-charging operations.

In addition, while node 236 is pulled down, node 234 is at high state (i.e., about Vcc) indicating that digital data has been generated. In other words, digital data read may be latched by output data latching circuit 203. In a further embodiment, when node 236 goes low, inverter 222 of virtual ground controller 207 will also receive a high signal as an input. Accordingly, inverter 222 will invert the high signal and produce a low signal that is provided at node 248. In this manner, cascode transistor 220 is simultaneously shut off. Of course, once cascode transistor 220 is shut off (i.e., cascode transistor 220 acts like an infinite resistor), amplifier circuit 205 is in a power saving "off" state. In addition, a heavily loaded data bus 202 is essentially de-coupled from a now lightly loaded node 236.

In addition, just as cascode transistor 220 is shut off, the identical low signal output from inverter 222 is passed to virtual ground transistor 206. When virtual ground transistor 206 receives the low signal, virtual ground controller 207 will be shut down. As can be appreciated, power consumption is reduced since virtual ground controller 207 (when in a shut down state) will disable the coupled virtual ground generator 209 as shown in FIG. 2.

Figure 4:
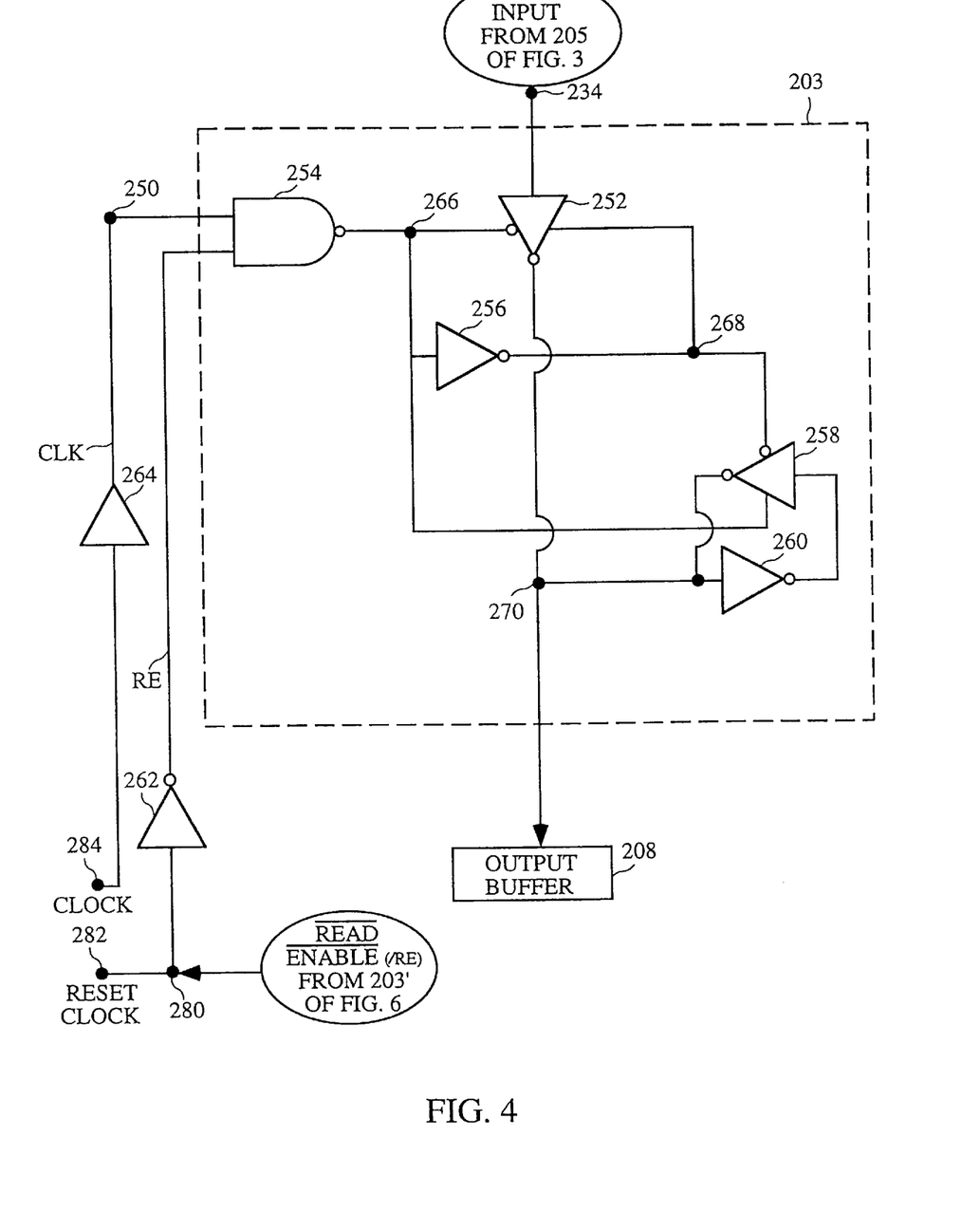
FIG. 4 is an exemplary circuit diagram for processing logical data through an output data latching circuit in accordance with one embodiment of the present invention.

FIG. 4 is an exemplary circuit diagram for processing logical data through output data latching circuit 203 in accordance with one embodiment of the present invention. As shown, node 234 of FIG. 3 represents an input to output data latching circuit 203, and node 234 is coupled to a tristate inverter 252. The output of tristate inverter 252 is coupled to a node 270 that defines an input to an inverter 260 and an output of a tristate inverter 258. In this embodiment, a p-type transistor of tristate inverter 252 is coupled to anode 266 that preferably represents an output of NAND gate 254.

Node 266 is also an input to an inverter 256 that outputs to anode 268. In turn, node 268 is coupled to an n-type transistor contained within tristate inverter 252, and to a p-type transistor contained within tristate inverter 258. Node 266 is also shown connected to an n-type transistor contained within tristate inverter 258. Preferably, inverter 260 forms part of a latching circuit whose output is connected to the input of tristate inverter 258. Further, node 270 is coupled to an output buffer 208 that is configured to receive data being output from output data latching circuit 203.

In one embodiment, a read-enable (/RE) signal input is received from dummy sense amplifying core 201' of FIG. 2. As shown, /RE signal is passed to a node 280 that is also coupled to a reset clock node 282. Node 280 is then coupled to an inverter 262 that outputs an inverted read-enable (RE) signal to NAND gate 254. A clock node 284 preferably coupled to a clock buffer 264 that outputs a CLK to node 250, and node 250 connects to NAND gate 254.

When data sensing occurs during a read operation, each of the respective amplifier circuits 205 of each sense amplifying cores 201 perform a suitable amplifying operation. While, sensing and amplification is being processed in each of the amplifier circuits 205, dummy data sensing and amplification will also be performed in dummy sense amplifier core 201' (of FIG. 2) in order to ascertain an appropriate time to turn "on" output data latching circuit 203. Of course, dummy sense amplifying core 201' is slightly less optimum (i.e., a slight slower) than each of the sense amplifying cores 201 to ensure that digital data is sitting at node 234 and is ready to be processed through output data latching circuit 203.

Accordingly, output data latching circuit 203 will be in a non-power consuming state before dummy sense amplifying core 201' provides a /RE signal at node 280. In this embodiment, clock is passed in at node 284, and then passed through a clock buffer 264 to prevent clock loading. Once passed through clock buffer 264, a CLK signal is passed to node 250 at the input of NAND gate 254. The output of inverter 262 now passes an RE signal to NAND gate 254. When RE and CLK are HI, NAND gate 254 will output a /CLK signal to node 266. /CLK at node 266 is then concurrently passed to a p-type transistor contained within tristate inverter 252, inverter 256, and an n-type transistor contained within tristate inverter 258.

Output from inverter 256 is a CLK signal that is passed to node 268. At node 268 CLK is passed to an n-type transistor contained within tristate inverter 252 and a p-type transistor contained within tristate inverter 258. Now that RE is HI and CLK is HI at node 268, the latching circuit will now open. By way of example, the latching circuit is open because the n-type transistor within tristate inverter 252 is shifted into an "on" state, and the p-type transistor within tristate inverter 258 is shifted into an "off" state.

Once these conditions are achieved, digital data sitting at node 234 is passed through tristate inverter 252 allowing the digital data to propagate out to output buffer 208. In one embodiment, when the digital data is propagated to output buffer 208, a simultaneous positive feedback occurs at inverter 260 that stores the digital data being read out to output buffer 208. By way of example, as digital data is propagated to output buffer 208, tristate inverter 252 is shifted to an off state, and tristate inverter 258 is shifted to an on state. In this manner data is appropriately latched within latching inverters 260 and 258.

It should be appreciated that output data latching circuit 203 is only open for a short "pulse" duration. Preferably, the short pulse duration is defined from when RE signal goes HI to when CLK signal goes LOW. By way of example, CLK goes LOW after a short pulse duration defined by the /RE signal received from dummy sense amplifying core 201' that resets clock at node 282. Accordingly, once that digital data has been propagated out and latched, output data latching circuit 203 is once again placed in an off state. Advantageously, the rapid on/off switching of output data latching circuit 203 provides substantial power savings, which may be substantial when a plurality of sense amplifying cores 201 are implemented to read N-bit wide data.

Figure 5:
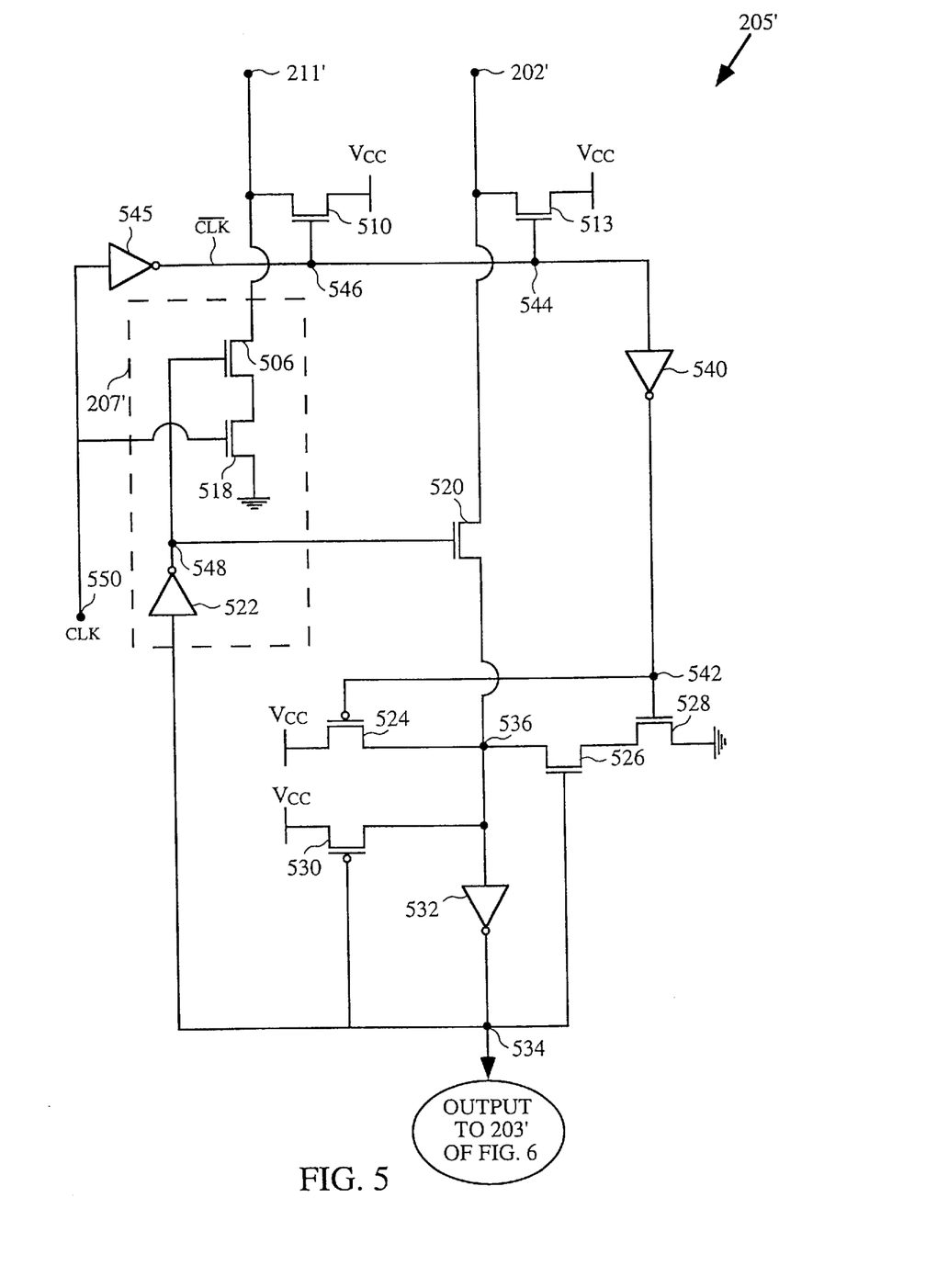
FIG. 5 is a circuit diagram illustrating preferred electrical interconnections within a dummy amplifier circuit and a dummy virtual ground controller in accordance with one embodiment of the present invention.

FIG. 5 is a circuit diagram illustrating preferred transistor interconnections contained within dummy amplifier circuit 205' and virtual ground controller 207' in accordance with one embodiment of the present invention. As shown, the circuit interconnections provided in dummy amplifier circuit 205' are substantially the same as those provided in each of the amplifier circuits 205 of FIG. 3. As described above, the mirror duplication of dummy amplifier circuit 205' is preferably well suited to replicate the loading and timing experienced by the amplifier circuits 205, and to avoid prematurely delivering a read enable signal to the output data latching circuits 203. In any manner, a circuit interconnection description is provided to point out various advantageous features of this embodiment.

A virtual ground control line 211' is coupled to a drain side of a pre-charger transistor 510, and the source of pre-charger transistor 510 is connected to Vcc. The gate of pre-charger transistor 510 is coupled to a node of 546 that is electrically identical to node 544. Node 544 is in turn coupled to the gate of a second pre-charger transistor 513. In this embodiment, pre-charger transistor 513 has a source connected to Vcc and a drain coupled to a dummy data bus line 202'. Pre-charger transistors 510 and 513 are preferably n-type transistors that provide an appropriate threshold voltage difference across each associated transitor channel. Once Vcc is set to about 3.3 volts, the voltage on virtual ground control line 211' and dummy data bus 202' is about Vcc−Vt(Vt=threshold voltage). As can be appreciated, lowering the voltage of Vcc by about Vt further contributes to reduce power consumption.

A clock, (CLK) signal is shown coupled to a node 550 for providing CLK to a clock buffer 545 and a virtual ground transistor 518. The CLK signal is passed through clock buffer 545 that inverts CLK to produce a /CLK signal to nodes 546 and 544. In this embodiment, a virtual ground transistor 518 is shown coupled to ground and a virtual ground transistor 506. Virtual ground transistor 506 is also coupled to virtual ground control line 211'. The gate of virtual ground transistor 506 is connected to a node 548 that is the output of an inverter 522 contained within dummy virtual ground controller 207'.

In this embodiment, node 548 also represents a gate connection to a cascode transistor 520. Cascode transistor 520 is in turn coupled to dummy data bus 202' at the drain of pre-charger transistor 513. Cascode transistor 520 is further connected to a node 536. Node 536 is also connected to a source of a transistor 524 and ad rain of a feedback transistor 526. As shown, transistor 524 is preferably a p-type transistor having its drain connected to Vcc and its gate connected to a node 542. Node 452 also makes a gate connection to a transistor 528 that is shown connected to ground and feedback transistor 526. Further, the gate of feedback transistor 526 is shown coupled to a node 534 that preferably defines the output of amplifier circuit 505.

Node 536 is also preferably connected to a source of a transistor 530 and also defines an input to an inverter 532.

The drain of transistor 530 is connected to Vcc and the gate is connected to node 534. As shown, node 534 also defines an input to inverter 522 containing within dummy virtual ground controller 207'. Further shown is an inverter 540 having an input coupled to node 544 and an output leading to node 542. As described above, node 542 provides a common path to the gates of both transistors 524 and transistor 528.

In operation, dummy amplifier circuit 205' preferably mirrors the loading and timing of each of the N amplifier circuits 205. To further ensure that dummy amplifier circuit 205' does not provide a premature read enable signal (i.e. too fast) before the various amplifier circuits 205 are done amplifying, dummy amplifier circuit 205' will preferably be designed to always read a logical"0". As is well known in the art, reading a logical"0"is slower than reading a logical"1"because a transistor intersection is being sensed and amplified.

Figure 6:
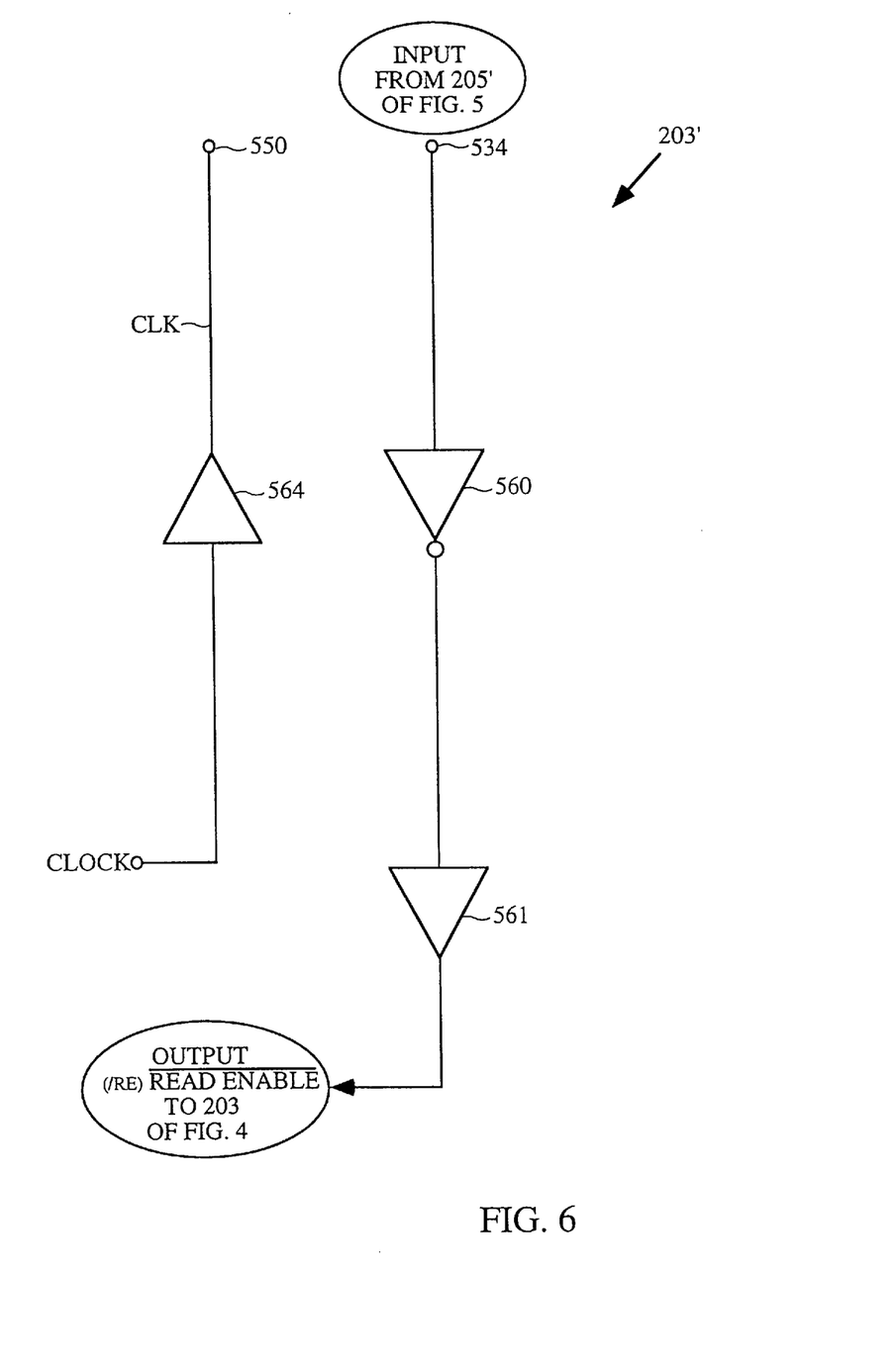
FIG. 6 shows a circuit diagram of various electrical elements contained within a dummy output data latching circuit in accordance with one embodiment of the present invention.

FIG. 6 shows a circuit diagram of various elements contained within dummy output data latching circuits 203' in accordance with embodiment of the present invention. As shown, a node 534 represents the input from dummy amplifying circuit 205' of FIG. 5. Node 534 is also coupled to an inverter 560 that is generally used to swing /RE high during one phase and low during another phase. By way of example during pre-charged of dummy amplifying circuit 205',/RE is preferably high. On the other hand, during sensing and amplification within dummy amplifying circuit 205', /RE is preferably low.

The output of inverter 560 is then passed to a buffer 561 which is preferably a high drive buffer. In this embodiment, the high drive buffer is used to provide enough drive to propagate the /RE signal to one or N output data latching circuits 203 that may be implemented to output one or N bits respectively. Also shown is a clock signal being passed to a clock buffer 564 which outputs CLK to a node 550 as described in FIG. 5. As described above, CLK signal passed to node 550 assist in turning off dummy amplifying circuit 205' once the sensing and amplifying operations have been performed within dummy amplifier circuit 205'. Advantageously, power is once again saved by shutting down amplifier circuit 205' when a sensing operation is not in progress.

Figure 7A:
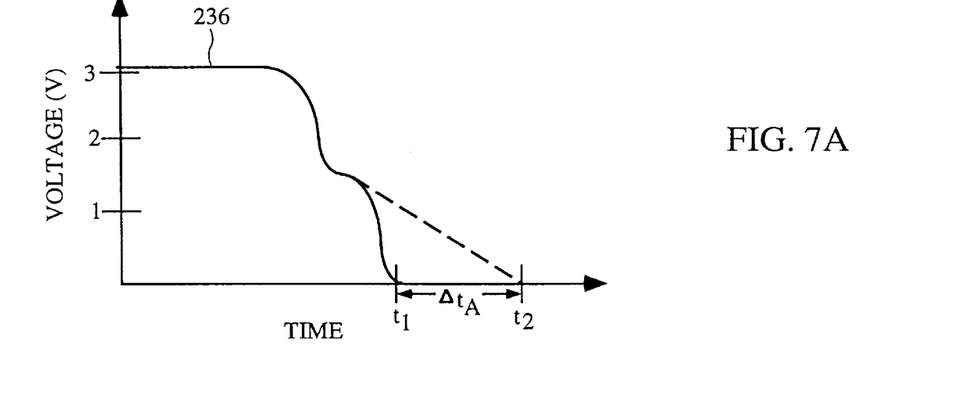
FIG. 7A through 7C shows various voltage versus time plots of exemplary voltage responses within the architecture of FIG. 2 in accordance with one embodiment of the present invention.

FIG. 7A shows a plot of voltage versus time of the voltage level response at node 236 in accordance with one embodiment of the present invention. As described with reference to amplifier circuit 205 of FIG. 3, positive feedback transistor 226 is preferably implemented to assist in rapidly pulling down the voltage level at node 236 once amplification of the sensed data is complete. As shown, a dashed line represents a slow conventional voltage decline at node 236 when pull down assistance is not provided at node 236.

As depicted, most conventional amplifier circuits 205 decline at a slower rate which may be associated with a delay of $AEt_A$ ($t_1$–$t_2$). Accordingly, in a preferred embodiment, the voltage level at node 236 is rapidly pulled down at time $t_1$ to cease any more power from being consumed. That is, once the voltage level at node 236 is pulled down to zero at time $t_1$, substantially no more power will be consumed since the voltage component of power is zero (e.g., AC power=$CV^2f$).

Figure 7B:
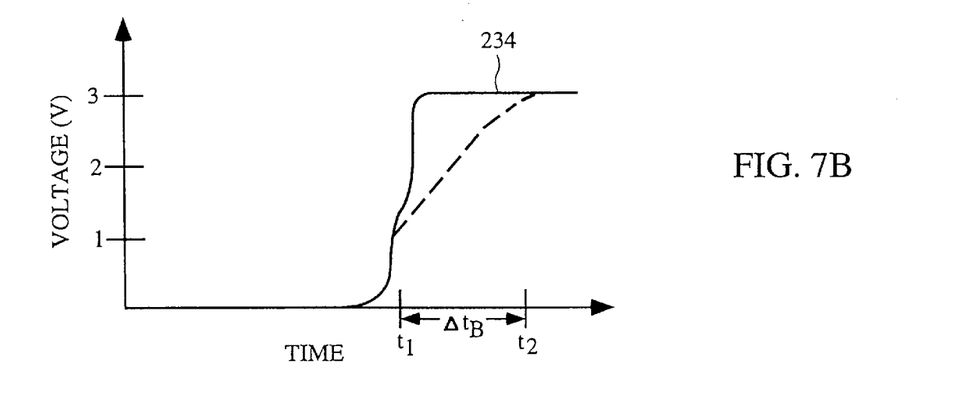

FIG. 7B shows a plot of voltage versus time of the voltage level response at node 234 in accordance with one embodiment of the present invention. In this embodiment, node 234 represents the output of amplifier circuit 205 of FIG. 3. In general, when node 234 reaches a high voltage state (e.g., 3.3 volts or any other suitable rail voltage), amplifying circuit 205 produces digital data at node 234. However, some conventional amplifier circuits experience a substantial delay $AEt_B$ ($t_1$–$t_2$) in providing digital data as shown by the dashed line.

In this embodiment, delay AE $t_B$ is directly correlated to the delay $AEt_A$ experienced at node 236. However, because feedback transistor 226 assists in pulling down the voltage level at node 236, the voltage level at node 234 will likewise rise at a substantially faster rate. Accordingly, amplifying circuit 205 will not only consume less power, but also provide faster switching speeds that may be advantageous to consumer electronics products where low power consumption and fast memory access speeds are desired.

Figure 7C:
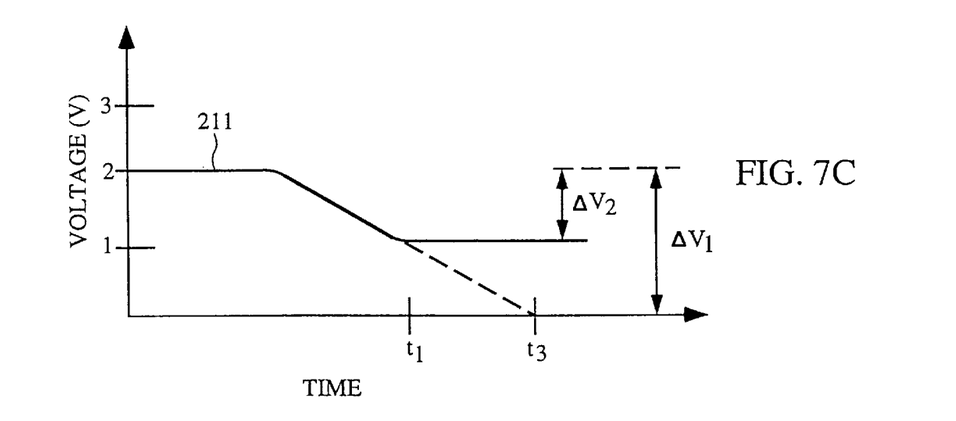

FIG. 7C shows a plot of voltage versus time of the voltage level response at virtual ground control line 211 in accordance with one embodiment of the present invention. In this embodiment, the voltage level of virtual ground control line 211 is about 3.3 volts minus Vt(Vt=threshold voltage of pre-charger transistor 210) before sensing is commenced within a suitably memory core. When sensing begins, the voltage level will begin to decline until a time $t_1$ when virtual ground controller 207 is turned off. At time $t_1$, amplifier circuit 205 has essentially completed its amplifying task. For comparison purposes, a dashed line representing the conventional response of a virtual ground control signal is shown declining to a time $t_3$.

In one embodiment of the present invention, when reading a "0" has been completed at a time $t_1$, virtual ground control line 211 is prevented from falling to zero volts. As such, once reading is completed at a time $t_1$, the voltage level is kept at a constant voltage. IN this manner, during pre-charging, the voltage level of virtual ground control line 211 need only be charged back up by about $AEV_2$, which saves substantial power that may have been wasted in pre-charging by about $AEV_1$, In other words, since virtual ground controller 207 is turned off at transistor 206 when digital data is produced at node 234, the voltage on virtual ground control line 211 is not allowed to drop to a zero level.

Advantageously, substantial power is saved since pre-charging transistor 210 (of FIG. 3) only needs to be charged up by about $AEV_2$ before the next reading operation. Of course, the power consumption saved is even greater when it is considered that a plurality of sense amplifying cores 201 (of FIG. 2) may be implemented to read N-bit wide data from a memory device.

Although the foregoing invention has been described in some detail for purposes of clarity of understanding, it will be apparent that certain changes and modifications may be practiced within the scope of the appended claims. By way of example, although the power saving features of the various embodiments have been described with reference to read only memory devices, these features are equally applicable to any suitable electrical device that may require low power amplification.

In addition, it should be understood that the various circuit diagrams may be embodied in any form which may include, for example, any suitable semiconductor substrate, printed circuit board, packaged integrated circuit, or software implementation. Accordingly, the present embodiments are to be considered as illustrative and not restrictive, and the invention is not to be limited to the details given herein, but may be modified within the scope and equivalents of the appended claims.

What is claimed is:

1. A low power amplifier circuit, comprising:
   a data bus line for receiving a data signal from a selected column of a memory array, the data bus line being coupled to a first pre-charger transistor for limiting a data bus voltage swing;
   a virtual ground control line for controlling a virtual ground application to a selected column of the memory array, the virtual ground application is configured to provide a path to ground for the selected column, and the virtual ground control line is coupled to a second pre-charger transistor for limiting a virtual ground voltage swing;
   a gain transistor configured to receive the data signal from the data bus line and to provide an amplified data signal to a pull down node located at an input of an inverter; and
   a digital data output node located at an output of the inverter, the digital data output node is coupled to a control terminal of a positive feedback transistor, and a source/drain terminal of the positive feedback transistor is coupled to the pull down node.

2. A low power amplifier circuit as recited in claim 1, wherein the positive feedback transistor is an n-type transistor.

3. A low power amplifier circuit as recited in claim 1, wherein the digital data output node is coupled to a virtual ground controller, the virtual ground controller including a virtual ground inverter for shifting a received high signal into a low output signal.

4. A low power amplifier circuit as recited in claim 3, wherein the low output signal is coupled to a control terminal of the gain transistor.

5. A low power amplifier circuit as recited in claim 3, wherein the low output signal is coupled to a control terminal of a virtual ground transistor.

6. A low power amplifier circuit as recited in claim 5, wherein when the high signal is received at the digital data output node, the virtual ground inverter provides a low signal to the control terminal of the virtual ground transistor and the control terminal of the gain transistor to substantially contemporaneously shift the low power amplifier and the virtual ground controller off.

7. A low power amplifier circuit as recited in claim 6, wherein the virtual ground transistor is an n-type transistor.

8. A low power amplifier circuit as recited in claim 6, wherein the gain transistor is an n-type transistor.

9. A low power output data latching circuit, comprising:
   a logic gate having a first input terminal that is configured to receive a clock signal and a second input terminal that is configured to receive a read enable signal, the logic gate having an output node that is coupled to a first node of a first tristate inverter, an input to a first inverter and a first node of a second tristate inverter;
   an activating node connecting an output of the first inverter, a second node of the first tristate inverter, and a second node of the second tristate inverter; and
   an output node connected to an output of the first tristate inverter, an input of a second inverter, and an output of the second tristate inverter.

10. A low power output data latching circuit as recited in claim 9, wherein the output node is coupled to an output buffer.

11. A low power output data latching circuit as recited in claim 10, wherein the output buffer is connected to an N-Bit Wide ROM output bus.

12. A low power output data latching circuit as recited in claim 10, wherein a digital data signal is configured to pass through the first tristate inverter and to the output buffer when the clock signal is high at the activating node and the read enable signal is high at the activating node.

13. A low power output data latching circuit as recited in claim 10, wherein a digital data signal is stored in a latching circuit comprising the second inverter and second tristate inverter when the clock signal is high at the activating node and the read enable signal is high at the activating node.

14. A low power amplifier system coupled to a data bus line for receiving a data signal from a selected column of a memory array, comprising:
   a first pre-charger transistor coupled to a data bus line, the first pre-charger transistor is configured to limit a voltage swing on the data bus line;
   a virtual ground control line for controlling a virtual ground application to a selected column of the memory array, the virtual ground application configured to provide a path to ground for the selected column, and the virtual ground control line being coupled to a second pre-charger transistor for limiting a virtual ground voltage swing;
   a gain transistor configured to receive the data signal from the data bus line and provide an amplified data signal to a pull down node located at an input of an inverter; and
   a digital data output node located at an output of the inverter, the digital data output node being coupled to a control terminal of a positive feedback transistor, and a source/drain terminal of the positive feedback transistor being coupled to the pull down node.

15. A low power amplifier system as recited in claim 14, wherein the digital data output node located at the output of the inverter is coupled to a low power output data latching circuit.

16. A low power amplifier system as recited in claim 14, wherein the digital data output node is coupled to a virtual ground controller, the virtual ground controller having a virtual ground inverter for shifting a received high signal into a low output signal.

17. A low power amplifier system as recite din claim 16, wherein the low output signal is coupled to a control terminal of the gain transistor.

18. A low power amplifier system as recited in claim 16, wherein the low output signal is coupled to a control terminal of a virtual ground transistor.

19. A low power amplifier circuit, comprising:
   a data bus line for receiving a data signal from a selected column of a memory array, the data bus line being coupled to a first pre-charger transistor for limiting a data bus voltage swing;
   a virtual ground control line for controlling a virtual ground application to a selected column of the memory array, the virtual ground application is configured to provide a path to ground for the selected column, and the virtual ground control line is coupled to a second pre-charger transistor for limiting a virtual ground voltage swing; and
   a gain transistor configured to receive the data signal from the data bus line and to provide an amplified data signal to a pull down node located at an input of an inverter.

20. A low power amplifier circuit comprising:
   a data bus line for receiving a data signal from a memory array, the data bus line being coupled to a first pre-charger transistor for limiting a data bus voltage swing;

a virtual ground control line for controlling a virtual ground application to the memory array, the virtual ground application is configured to provide a path to ground, and the virtual ground control line is coupled to a second pre-charger transistor for limiting a virtual ground voltage swing;

a gain transistor configured to receive the data signal from the data bus line and to provide an amplified data signal to a pull down node located at an input of a gate; and a digital data output node located at an output of the gate, the digital data output node is coupled to a control terminal of a positive feedback transistor, a source/drain terminal of the positive feedback transistor is coupled to the pull down node, and the digital data output node is further coupled to a virtual ground controller that shifts a received high signal into a low output signal that is transferred to a control terminal of the gain transistor, which turns off the gain transistor;

wherein the low output signal is further communicated to a control terminal of a virtual ground transistor that is part of the virtual ground controller, which turns off the virtual ground controller.

21. A low power output data latching circuit, controlling:

a logic gate configured to receive a high clock signal and a high read enable signal, the logic gate having an output node that is coupled to a p-type transistor of a first tristate inverter, an input to a first inverter and an n-type transistor of a second tristate inverter; and an activating node connecting an output of the first inverter, an n-type transistor of the first tristate inverter, and a p-type transistor of the second tristate inverter.

22. A low power output data latching circuit as recited in claim 21, further comprising an output node that is connected to an output of the first tristate inverter, an input of a second inverter, and an output of the second tristate inverter, such that a digital data signal is configured to pass through the first tristate inverter and to an output buffer that is coupled to the output node.

* * * * *